United States Patent
Wang et al.

(10) Patent No.: US 12,131,846 B2
(45) Date of Patent: Oct. 29, 2024

(54) CONNECTING CABLE, CABLE CONNECTOR, CHARGER AND CHARGER ASSEMBLY WITH IMPROVED HEAT DISSIPATION STRUCTURE

(71) Applicant: LUXSHARE ELECTRONIC TECHNOLOGY (KUNSHAN) LTD., Kunshan (CN)

(72) Inventors: Tao Wang, Kunshan (CN); Qinghong Zhao, Kunshan (CN); Xiaolong Liu, Kunshan (CN); Ji Wei, Kunshan (CN)

(73) Assignee: LUXSHARE ELECTRONIC TECHNOLOGY (KUNSHAN) LTD., Kunshan (CN)

( * ) Notice: Subject to any disclaimer, the term of this patent is extended or adjusted under 35 U.S.C. 154(b) by 471 days.

(21) Appl. No.: 17/500,393

(22) Filed: Oct. 13, 2021

(65) Prior Publication Data
US 2022/0172862 A1    Jun. 2, 2022

(30) Foreign Application Priority Data

Dec. 1, 2020  (CN) .......................... 202011382453.7

(51) Int. Cl.
*H01B 7/42*  (2006.01)
*H01B 7/18*  (2006.01)
(Continued)

(52) U.S. Cl.
CPC ........... *H01B 7/421* (2013.01); *H01B 7/1855* (2013.01); *H01R 13/516* (2013.01); *H01R 24/60* (2013.01);
(Continued)

(58) Field of Classification Search
CPC ........ H01B 7/421; H01B 7/1855; H01B 7/42; H01R 13/516; H01R 24/60; H01R 24/68;
(Continued)

(56) References Cited

U.S. PATENT DOCUMENTS 8,208,250 B2 *  6/2012  Mongia ................. G06F 1/1632
                                                                312/236
9,553,389 B2    1/2017  Manahan et al.
(Continued)

FOREIGN PATENT DOCUMENTS

CN        201349067 Y      11/2009
CN        203369042 U      12/2013
(Continued)

OTHER PUBLICATIONS

English Translation JP2014179235, Kitamura Shigeyoshi; Sharp Corp, Published Sep. 25, 2014 (Year: 2014).*
(Continued)

*Primary Examiner* — Steven T Sawyer
(74) *Attorney, Agent, or Firm* — Birch, Stewart, Kolasch & Birch, LLP

(57) ABSTRACT

A connecting cable includes a first end, a second end and a heat dissipation channel in communication with the first end and the second end. The first end is adapted to connect with a first component. The second end is adapted to connect with a second component. The present disclosure also discloses a cable connector, a charger, and a charger assembly having the connecting cable. Compared with the prior art, in the present disclosure, by providing the heat dissipation channel in the connecting cable, the heat generated by the electronic device can be discharged in time through the heat dissipation channel. Therefore, the heat dissipation performance is improved.

8 Claims, 17 Drawing Sheets

(51) Int. Cl.
*H01R 13/516* (2006.01)
*H01R 24/60* (2011.01)
*H01R 24/68* (2011.01)
*H02J 50/12* (2016.01)
*H05K 7/20* (2006.01)

(52) U.S. Cl.
CPC .............. *H01R 24/68* (2013.01); *H02J 50/12* (2016.02); *H05K 7/20172* (2013.01)

(58) Field of Classification Search
CPC .... H01R 2201/06; H01R 31/06; H01R 13/42; H02J 50/12; H05K 7/20172; H05K 7/20136
See application file for complete search history.

(56) References Cited

U.S. PATENT DOCUMENTS

| | | | | |
|---|---|---|---|---|
| 9,824,794 | B1* | 11/2017 | McNutt | H01B 7/04 |
| 2012/0202373 | A1* | 8/2012 | Klinghult | G06F 1/266 |
| | | | | 439/485 |
| 2017/0125958 | A1* | 5/2017 | Kim | H01B 7/0009 |
| 2018/0014430 | A1* | 1/2018 | Lin | H05K 7/20145 |

FOREIGN PATENT DOCUMENTS

| | | |
|---|---|---|
| CN | 103997083 A | 8/2014 |
| CN | 205656894 U | 10/2016 |
| CN | 206489904 U | 9/2017 |
| CN | 206922486 U | 1/2018 |
| CN | 207732474 U | 8/2018 |
| CN | 207765753 U | 8/2018 |
| CN | 208142453 U | 11/2018 |
| CN | 109103718 A | 12/2018 |
| CN | 208315991 U | 1/2019 |
| CN | 109378978 A | 2/2019 |
| CN | 208489664 U | 2/2019 |
| CN | 208797322 U | 4/2019 |
| CN | 209982214 U | 1/2020 |
| CN | 210490018 U | 5/2020 |
| CN | 210927191 U | 7/2020 |
| CN | 211150946 U | 7/2020 |
| CN | 107548480 B | 8/2020 |
| CN | 211480395 U | 9/2020 |
| TW | I627806 B | 6/2018 |

OTHER PUBLICATIONS

English Translation CN208797322, Shanghai Yuanyi Electronic, Published Sep. 27, 2019 (Year: 2019).*

* cited by examiner

CONNECTING CABLE, CABLE CONNECTOR, CHARGER AND CHARGER ASSEMBLY WITH IMPROVED HEAT DISSIPATION STRUCTURE

CROSS-REFERENCE TO RELATED APPLICATION

This patent application claims priority of a Chinese Patent Application No. 202011382453.7, filed on Dec. 1, 2020 and titled "CONNECTING CABLE, CABLE CONNECTOR, CHARGER AND CHARGER ASSEMBLY", the entire content of which is incorporated herein by reference.

TECHNICAL FIELD

The present disclosure relates to a connecting cable, a cable connector, a charger and a charger assembly, which belongs to a technical field of charging devices for electronic products.

BACKGROUND

Electronic products (such as mobile phones) have increasingly become indispensable communication tools in people's life, and they are being used more and more frequently. When a battery of the electronic product runs out of power, it needs to be charged through a charger. The charger usually includes a wired charger and a wireless charger.

In wired chargers, under high current and high power requirements, more and more heat is generated. This is easy to cause direct damage to the battery of the electronic product due to overheating during charging. In order to solve the heat problem during the charging, the heat dissipation method in the prior art is passive heat dissipation (for example, the heat dissipation is improved by increasing the heat dissipation area of the charger). However, the heat dissipation efficiency of the passive heat dissipation is not so good.

Since wireless chargers are more convenient to use than wired chargers, they are getting more and more praise from consumers. As wireless charging is used more and more frequently, and under high current and high power requirements, more and more heat is generated. Failure to dissipate heat in time will cause electronic products (such as charging trays) to overheat. Overheating of the charging tray can easily cause its own damage, and even cause overheating of electronic devices, such as the mobile phones and watches placed on the charging tray. This indirectly damages the batteries of the electronic devices such as the mobile phones and the watches, and causes the batteries to be unusable. In order to solve the heat dissipation problem of the wireless charging, the prior art is to install a heat dissipation device (such as a fan, a heat sink, etc.) in the charging tray. However, this will cause the charging tray to be too large and not portable. In addition, the air dispersal channel is located in the charging tray, which is also prone to interference problems.

SUMMARY

An object of the present disclosure is to provide a connecting cable, a cable connector, a charger, and a charger assembly with better heat dissipation function.

In order to achieve the above object, the present disclosure adopts the following technical solution: a connecting cable, including: a first end, the first end being adapted to connect with a first component; and a second end, the second end being adapted to connect with a second component; wherein the connecting cable further defines a heat dissipation channel in communication with the first end and the second end.

In order to achieve the above object, the present disclosure adopts the following technical solution: a cable connector, including: a first connector including a first plug end connected to an external environment; a second connector including a second plug end connected to the external environment; and a connecting cable; wherein the connecting cable defines a heat dissipation channel in communication with the first plug end and the second plug end.

In order to achieve the above object, the present disclosure adopts the following technical solution: a charger, including: a charger plug; and a connecting cable connected to the charger plug; wherein the charger plug includes a heat dissipation fan, the connecting cable includes a first end, a second end, and a heat dissipation channel in communication with the first end and the second end, the first end is directly or indirectly connected to the charger plug, the second end is adapted to connect with an electronic device; and wherein the heat dissipation fan is capable of dissipating heat generated by the electronic device through the heat dissipation channel.

In order to achieve the above object, the present disclosure adopts the following technical solution: a charger assembly, including: a charger, including a charger plug; and a connecting cable connected to the charger plug; wherein the charger plug includes a heat dissipation fan, the connecting cable includes a first end, a second end, and a heat dissipation channel in communication with the first end and the second end, the first end is directly or indirectly connected to the charger plug, the second end is adapted to connect with an electronic device; and wherein the heat dissipation fan is capable of dissipating heat generated by the electronic device through the heat dissipation channel; wherein the charger defines an airflow perforation in communication with the heat dissipation channel; wherein the charger assembly further includes an electronic device which is a wireless charging stand, the wireless charging stand is provided with an airflow through hole in communication with the heat dissipation channel, and the heat dissipation fan is capable of dissipating heat generated by the wireless charging stand through the airflow perforation or the airflow through hole.

Compared with the prior art, in the present disclosure, by providing the heat dissipation channel in the connecting cable, the heat generated by the electronic device can be discharged in time through the heat dissipation channel, thereby improving the heat dissipation performance.

DETAILED DESCRIPTION

Figure 1:
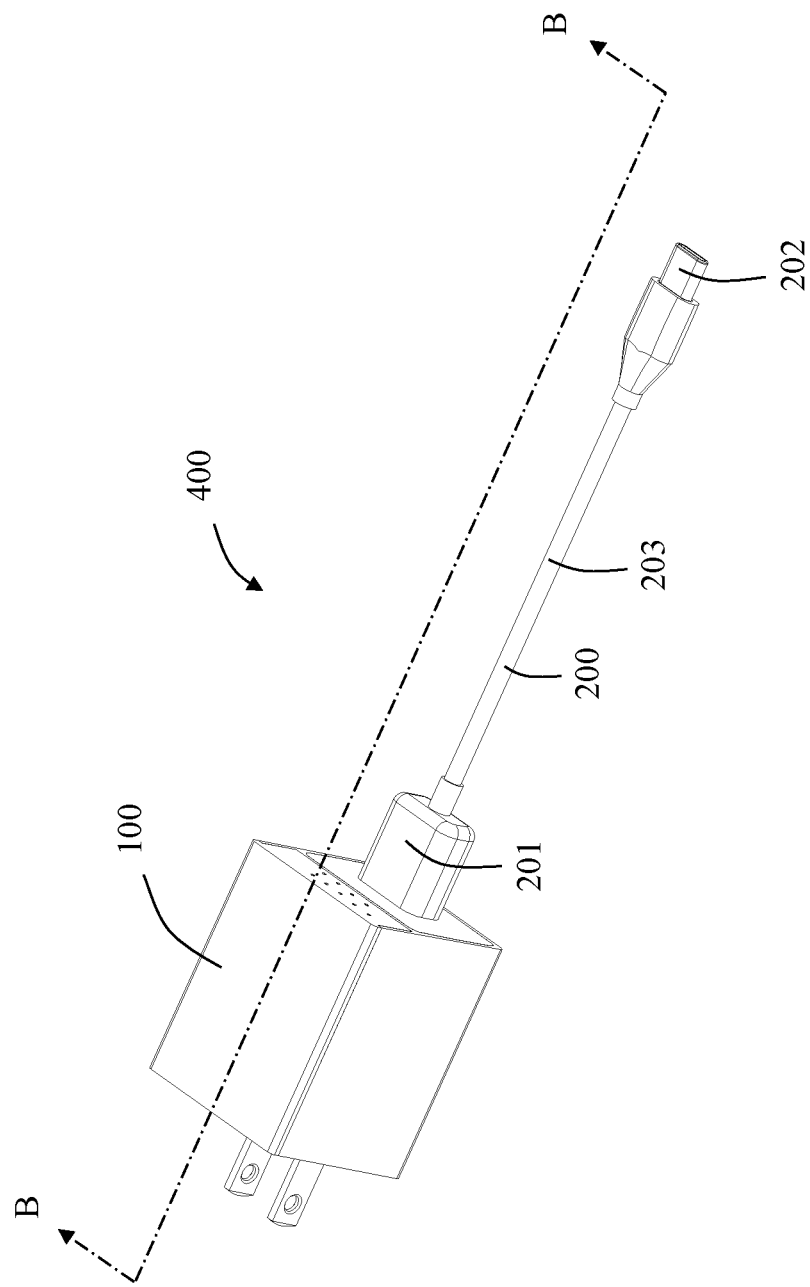
FIG. 1 is a perspective schematic view of a charger and a cable connector which are connected with each other in accordance with an embodiment of the present disclosure.

Exemplary embodiments will be described in detail here, examples of which are shown in drawings. When referring to the drawings below, unless otherwise indicated, same numerals in different drawings represent the same or similar elements. The examples described in the following exemplary embodiments do not represent all embodiments consistent with this application. Rather, they are merely examples of devices and methods consistent with some aspects of the application as detailed in the appended claims.

The terminology used in this application is only for the purpose of describing particular embodiments, and is not intended to limit this application. The singular forms "a", "said", and "the" used in this application and the appended claims are also intended to include plural forms unless the context clearly indicates other meanings.

It should be understood that the terms "first", "second" and similar words used in the specification and claims of this application do not represent any order, quantity or importance, but are only used to distinguish different components. Similarly, "an" or "a" and other similar words do not mean a quantity limit, but mean that there is at least one; "multiple" or "a plurality of" means two or more than two. Unless otherwise noted, "front", "rear", "lower" and/or "upper" and similar words are for ease of description only and are not limited to one location or one spatial orientation. Similar words such as "include" or "comprise" mean that elements or objects appear before "include" or "comprise" cover elements or objects listed after "include" or "comprise" and their equivalents, and do not exclude other elements or objects. The term "a plurality of" mentioned in the present disclosure includes two or more.

Hereinafter, some embodiments of the present disclosure will be described in detail with reference to the accompanying drawings. In the case of no conflict, the following embodiments and features in the embodiments can be combined with each other.

Referring to FIGS. 1 to 9, the present disclosure discloses a charger 400 that includes a charger plug 100 and a cable connector 200 connected to the charger plug 100. The charger plug 100 includes an insulating housing 101, a heat dissipation fan 102, a fan control board 103, a mating connector 105, and the like. The insulating housing 101 defines an installation space 104. The heat dissipation fan 102 and the fan control board 103 are installed in the installation space 104. The insulating housing 101 includes a base 1011 and a cover 1012 which is installed on the base 1011. The installation space 104 is jointly formed by the base 1011 and the cover 1012. The fan control board 103 is adapted to control the heat dissipation fan 102 to send a signal to operate the heat dissipation fan 102 when heat dissipation is required. In order to further improve the heat dissipation effect, the insulating housing 101 is provided with an airflow perforation 1013 that is in communication with the installation space 104 with the external environment. In the illustrated embodiment of the present disclosure, there are a plurality of airflow perforations 1013 provided on the cover 1012.

Figure 2:
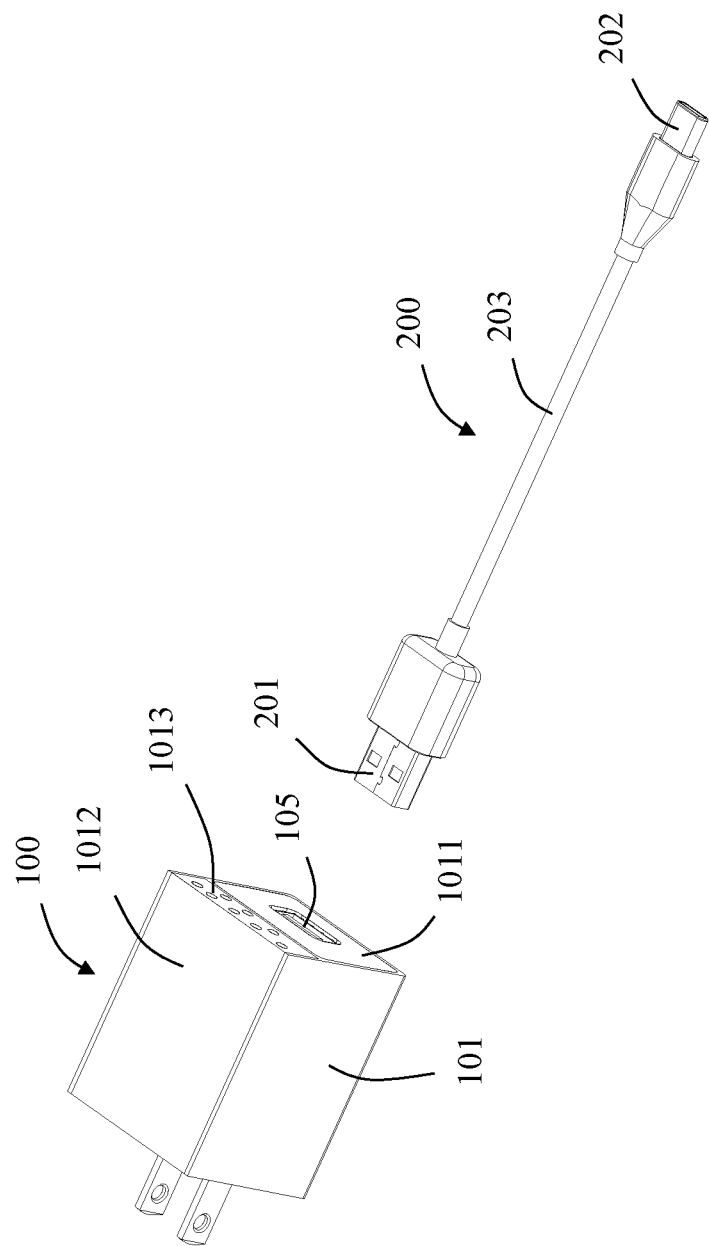
FIG. 2 is a perspective exploded view of FIG. 1, in which a charger plug and a cable connector are separated.
Figure 3:
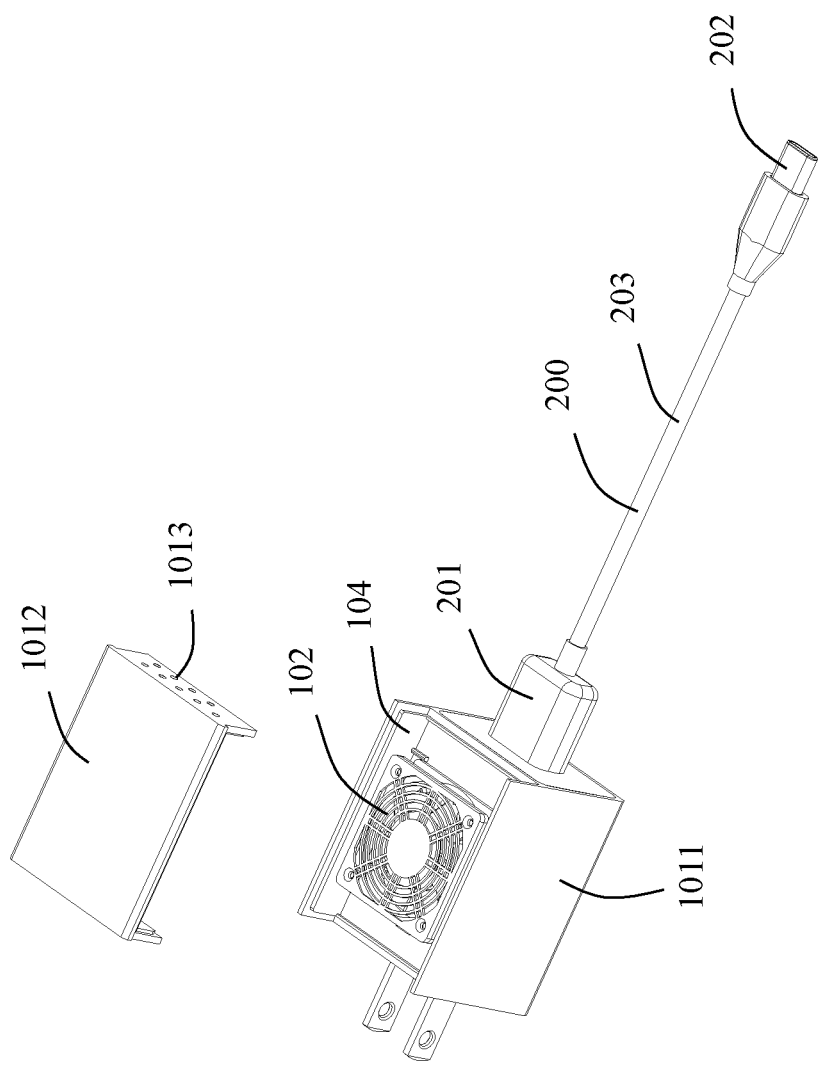
FIG. 3 is a partially exploded perspective view of FIG. 1, in which a part of a housing of the charger plug is separated.
Figure 4:
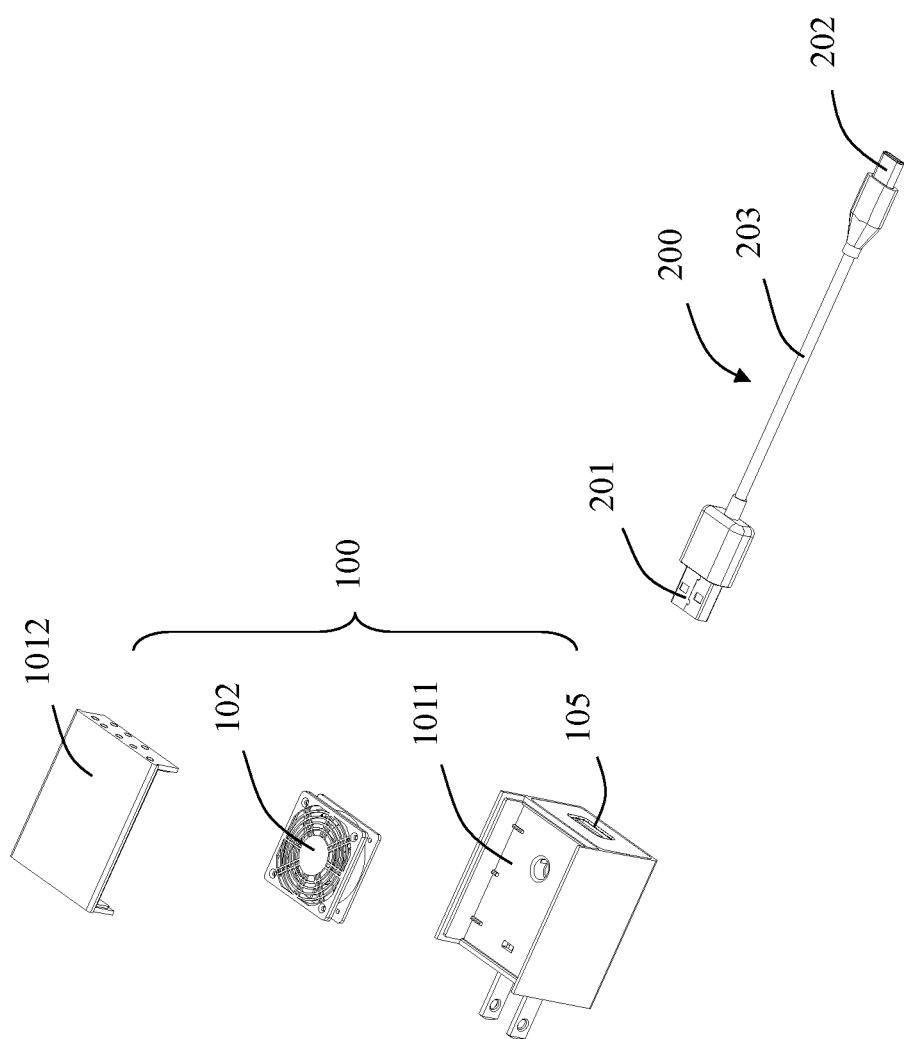
FIG. 4 is a partially exploded perspective view of FIG. 2.
Figure 5:
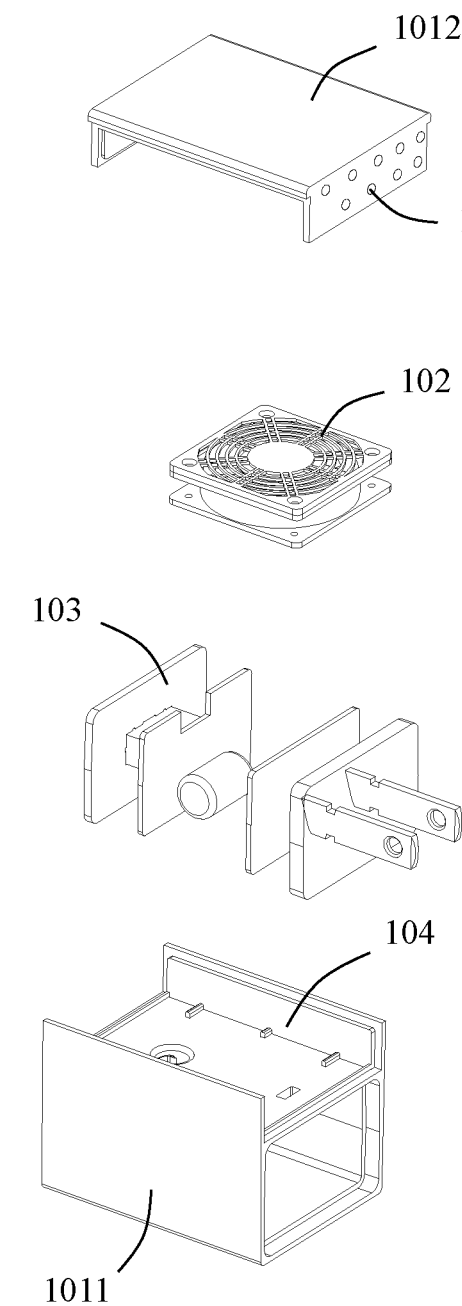
FIG. 5 is a perspective exploded view of the charger plug.
Figure 6:
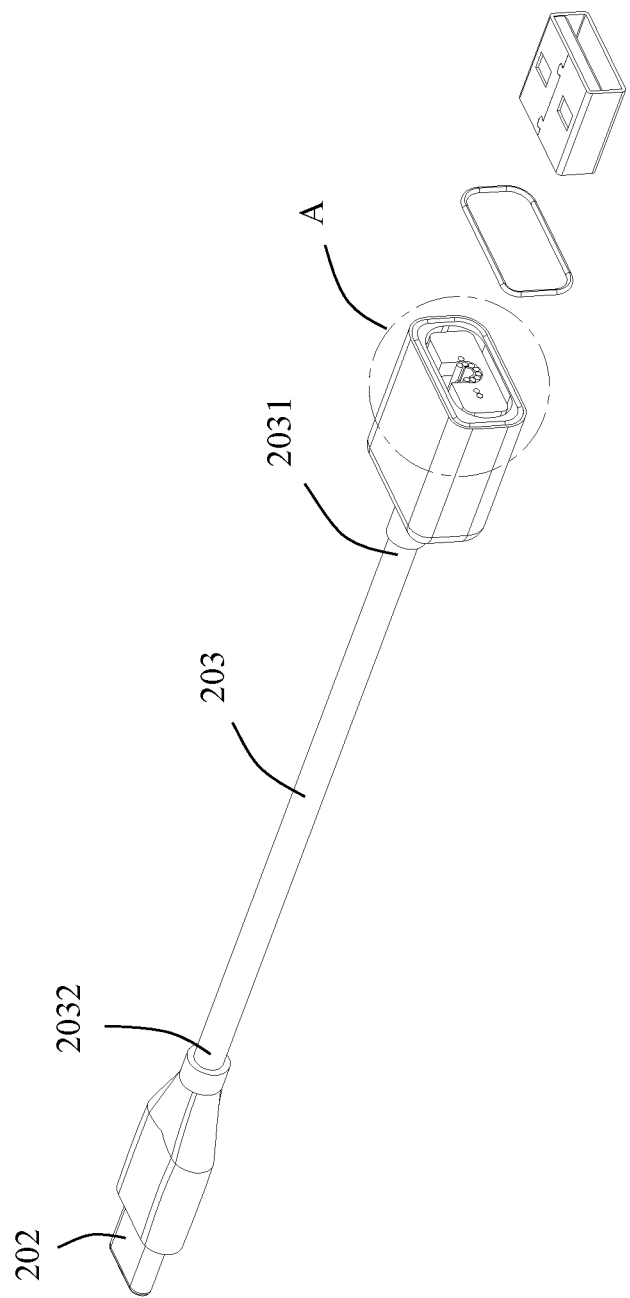
FIG. 6 is a partial perspective exploded view of a cable connector in accordance with an embodiment of the present disclosure.
Figure 7:
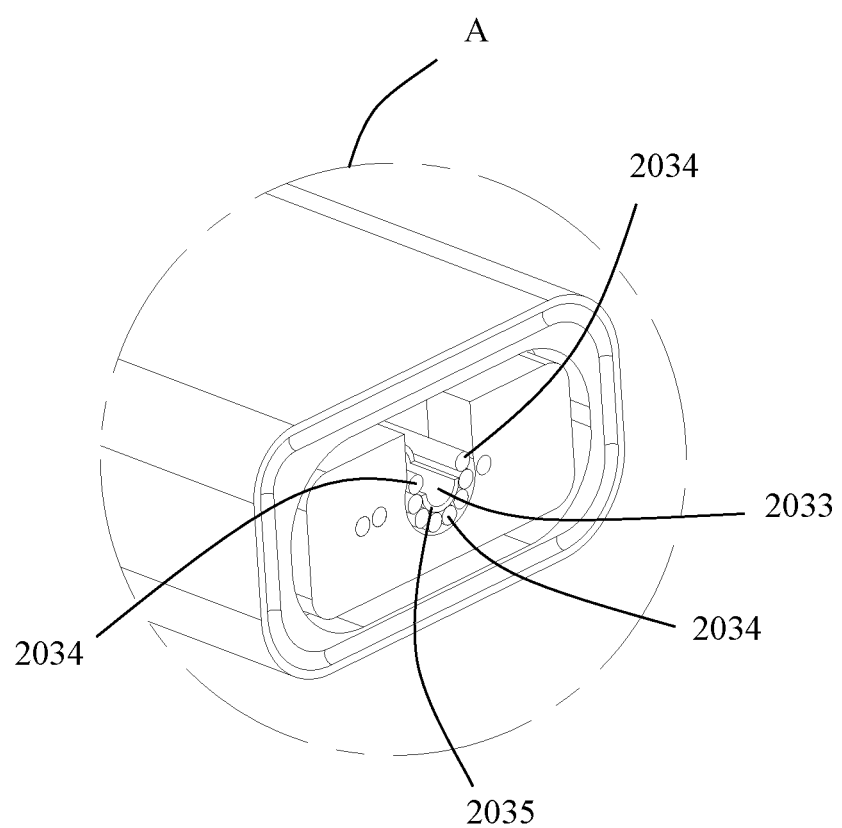
FIG. 7 is a partial enlarged view of a circled part A in FIG. 6.

Referring to FIGS. 2, 6 and 7, in an embodiment of the present disclosure, the cable connector 200 includes a first connector 201, a second connector 202, and a connecting cable 203 connecting the first connector 201 and the second connector 202.

In the illustrated embodiment of the present disclosure, the first connector 201 is a USB plug connector. The first connector 201 is provided with a first plug end 2011 connected to the external environment. In the illustrated embodiment of the present disclosure, the second connector 202 is a Type C plug connector. The second connector 202 is provided with a second plug end 2021 connected to the external environment. Of course, in other embodiments, the first connector 201 and the second connector 202 may also be other types of connectors.

Figure 8:
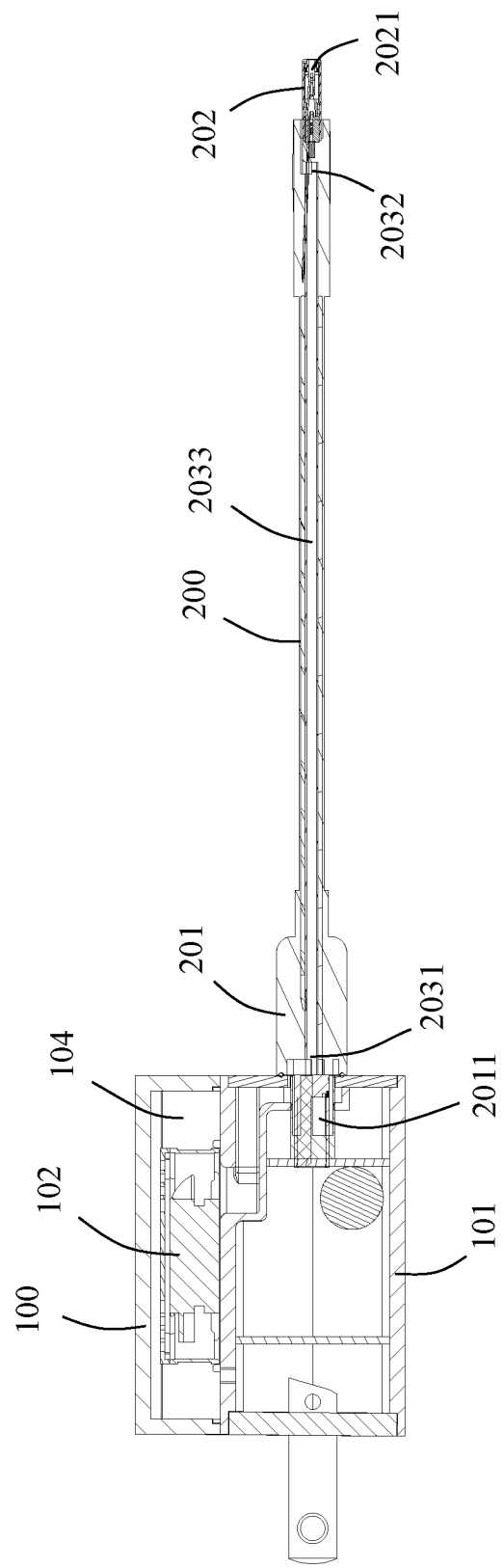
FIG. 8 is a schematic cross-sectional view taken along line B-B in FIG. 1.

Referring to FIG. 8, the connecting cable 203 includes a first end 2031, a second end 2032, and a heat dissipation channel 2033 in communication with the first end 2031 and the second end 2032. The first end 2031 is adapted to connect with a first component (for example, the first connector 201). The second end 2032 is adapted to connect with a second component (for example, the second connector 202). Of course, in other embodiments, the second end 2032 can also be adapted to connect with an electronic device. The electronic device includes, but is not limited to, a wireless charging stand, a second connector, a mobile phone, an earphone box, a power bank or a computer, etc. The first connector 201 is adapted to be inserted into the mating connector 105 of the charger plug 100 so as to realize electrical connection. Of course, in other embodiments, the first end 2031 can be directly connected to the charger plug 100, so that the first connector 201 can be omitted.

Figure 9:
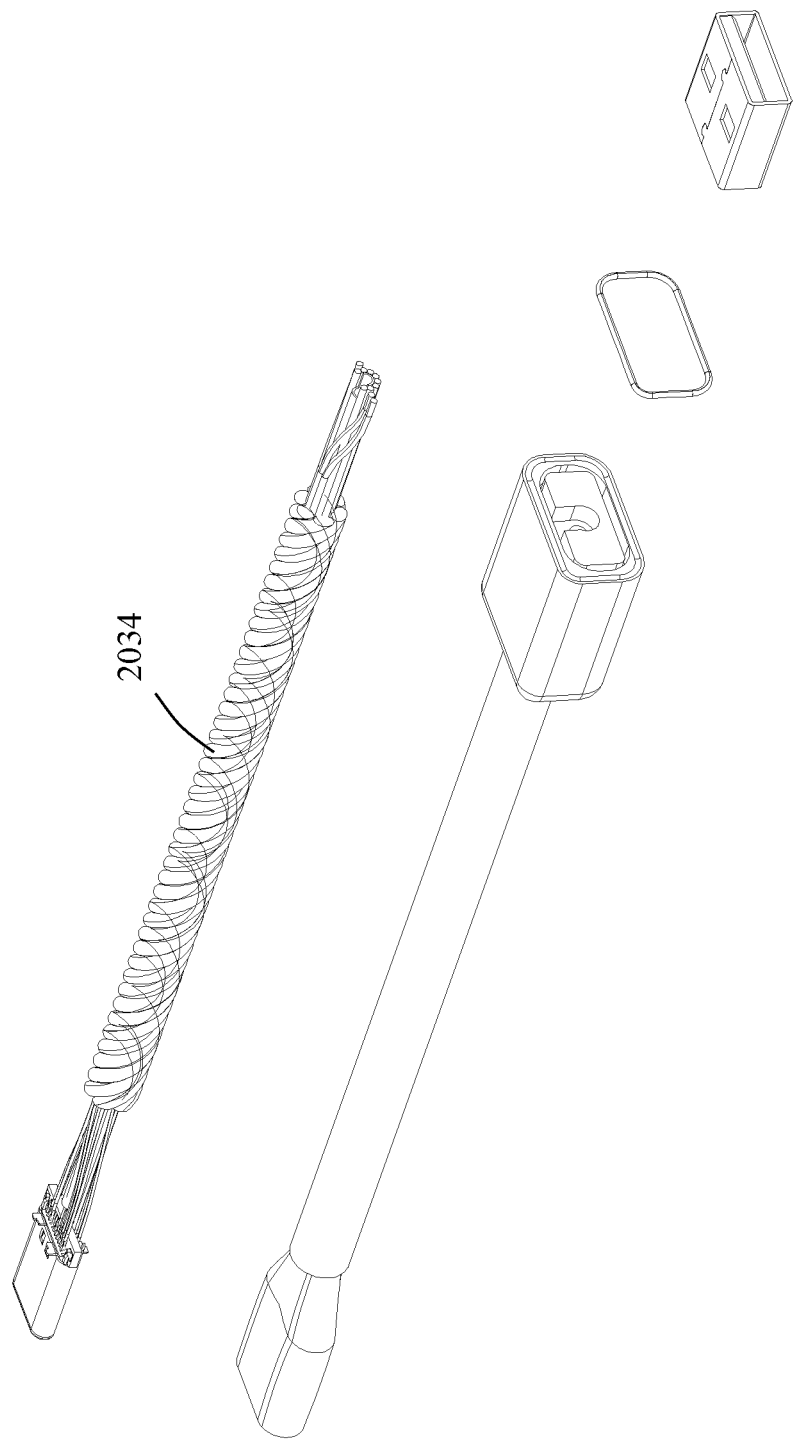
FIG. 9 is a further perspective exploded view of FIG. 6.
Figure 10:
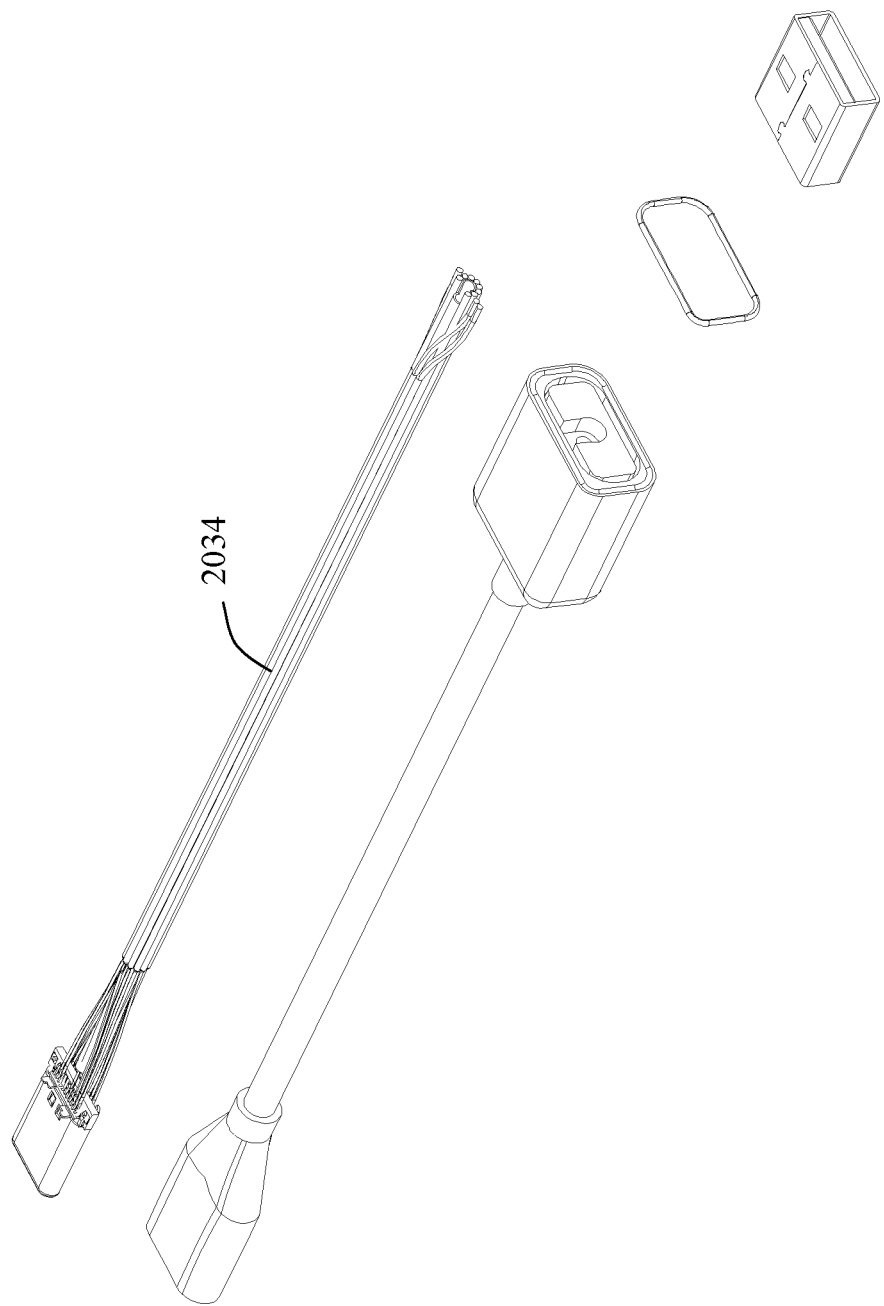
FIG. 10 is an exploded perspective view of another embodiment of FIG. 9.

Referring to FIG. 7, the connecting cable 203 includes a plurality of core wires 2034 electrically connected to the first component and the second component. The heat dissipation channel 2033 is located at a center of the plurality of core wires 2034. The installation space 104 of the charger plug 100 is in communication with the heat dissipation channel 2033. Referring to FIG. 9, in an embodiment of the present disclosure, the core wire 2034 may be wrapped on the heat dissipation channel 2033 in a spiral winding manner. Referring to FIG. 10, in an embodiment of the present disclosure, the core wires 2034 may also be wrapped on the heat dissipation channel 2033 in a manner substantially parallel to an axial direction. The connecting cable 203 includes a hollow heat dissipation pipe 2035. The heat dissipation pipe 2035 defines the heat dissipation channel 2033.

The core wire 2034 may be a general electronic wire. The connecting cable 203 may further include a shielding layer (not shown) that wraps the core wires 2034. The shielding layer can transfer the heat generated by the electronic device into the heat dissipation channel 2033, thereby facilitating heat dissipation. In an embodiment of the present disclosure, the shielding layer is made of a metal material. The metal material can be a metal with good thermal conductivity so as to promote rapid heat dissipation.

Figure 11:
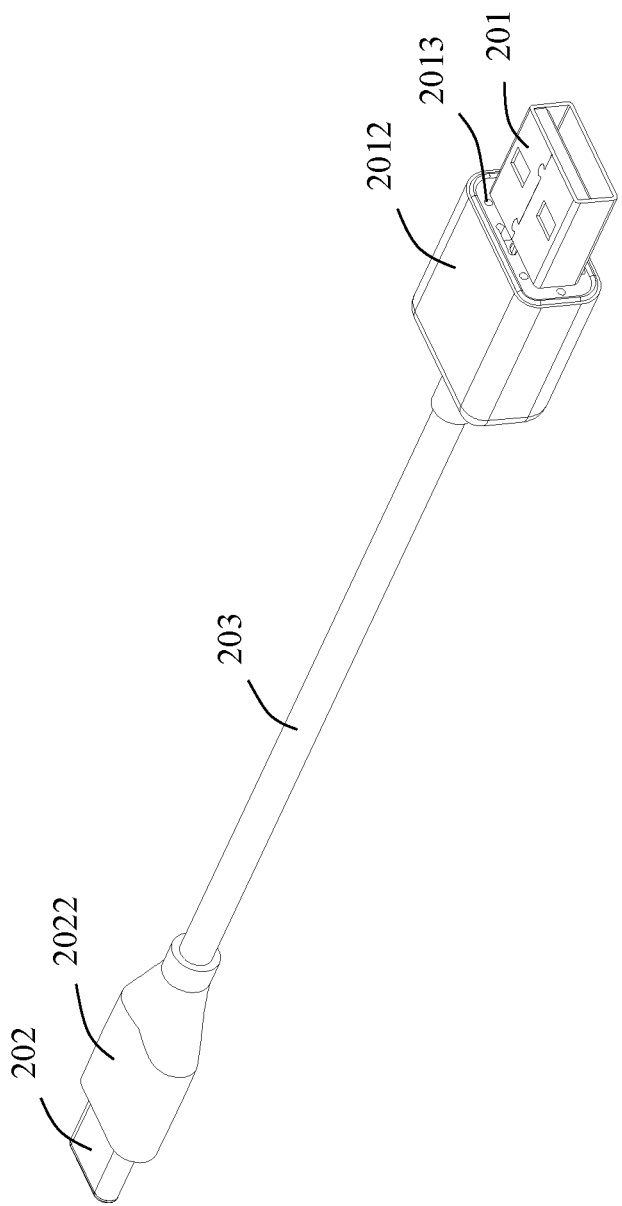
FIG. 11 is a perspective schematic view of the cable connector in accordance with another embodiment of the present disclosure.
Figure 12:
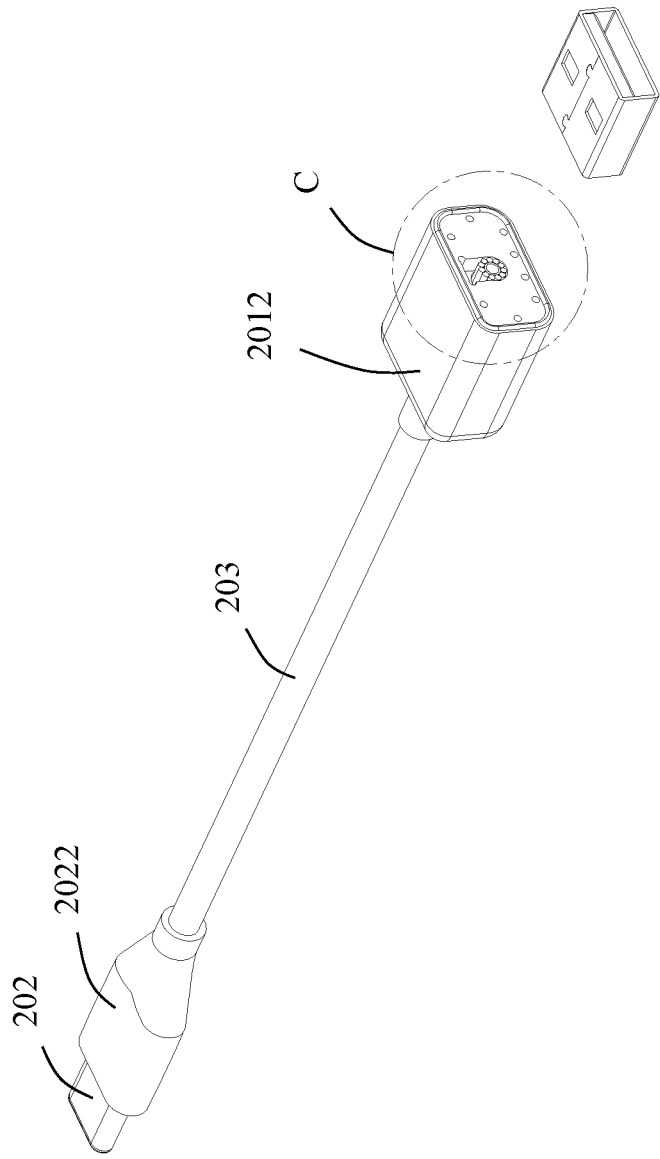
FIG. 12 is a partially exploded perspective view of FIG. 11.
Figure 13:
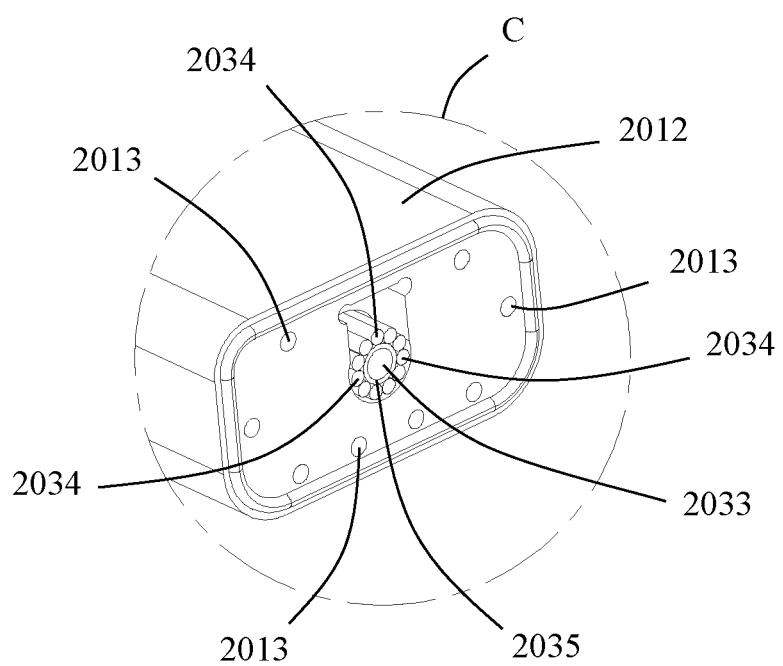
FIG. 13 is a partial enlarged view of a circled part C in FIG. 12.
Figure 14:
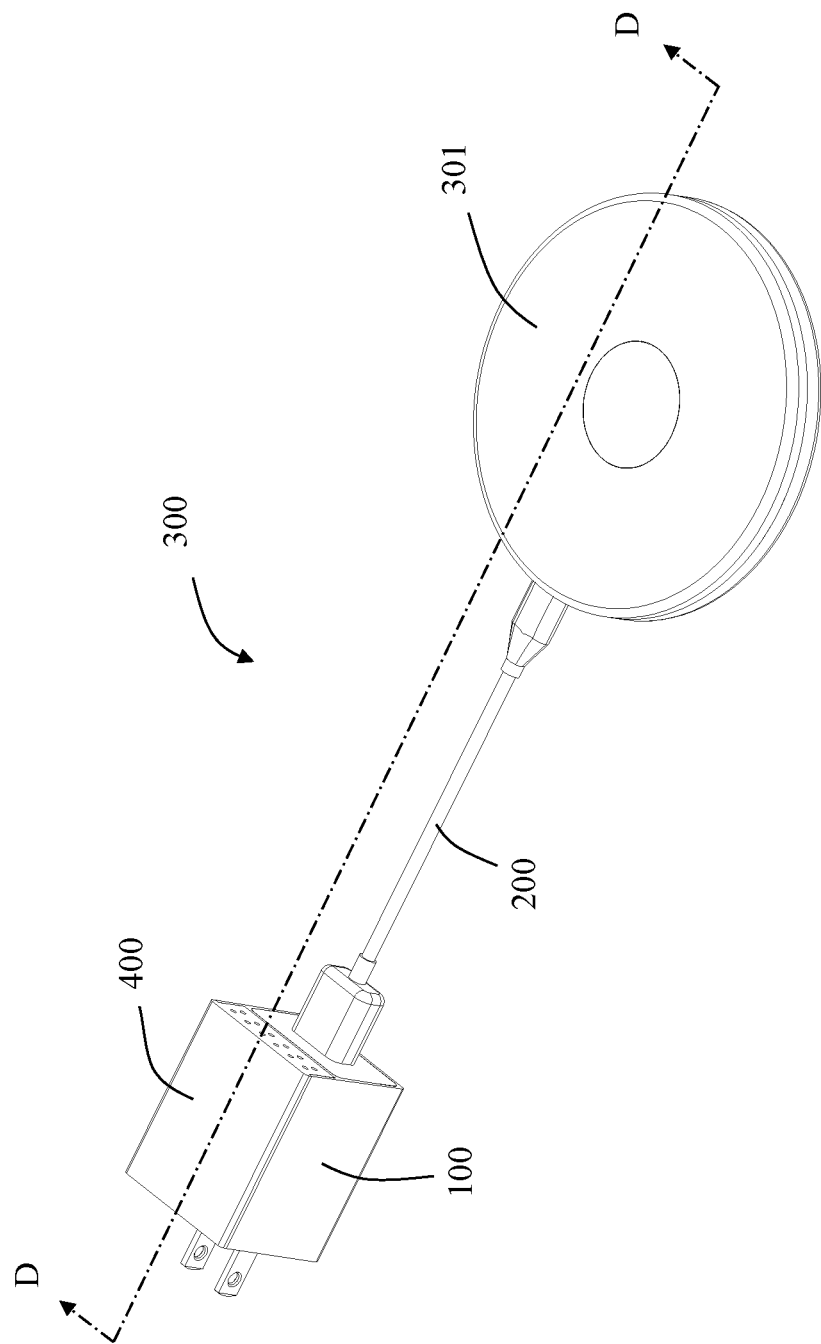
FIG. 14 is a perspective schematic view of a charger assembly in accordance with an embodiment of the present disclosure.
Figure 15:
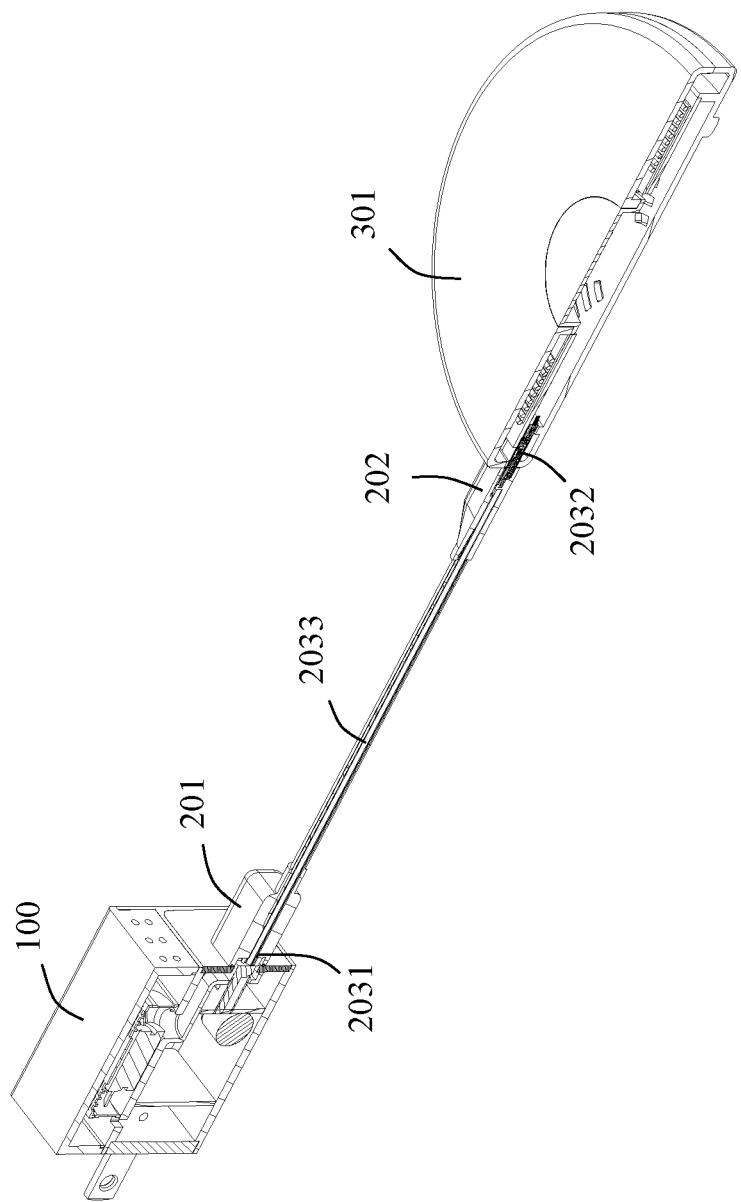
FIG. 15 is a schematic cross-sectional view taken along line D-D in FIG. 14.

Referring to FIGS. 11 to 13, the first connector 201 is provided with a first insulating coating shell 2012. The first insulating coating shell 2012 is provided with at least one first heat dissipation through hole 2013 in communication with the heat dissipation channel 2033. Regarding the cable connector 200 itself, the first heat dissipation through hole 2013 is in communication with the external environment. In an embodiment of the present disclosure, after the cable connector 200 is inserted into the charger plug 100, the first heat dissipation through hole 2013 is in communication with the installation space 104 of the charger plug 100.

Similarly, the second connector 202 is provided with a second insulating coating shell 2022. The second insulating coating shell 2022 is provided with at least one second heat dissipation through hole (not shown) in communication with the heat dissipation channel 2033.

Figure 16:
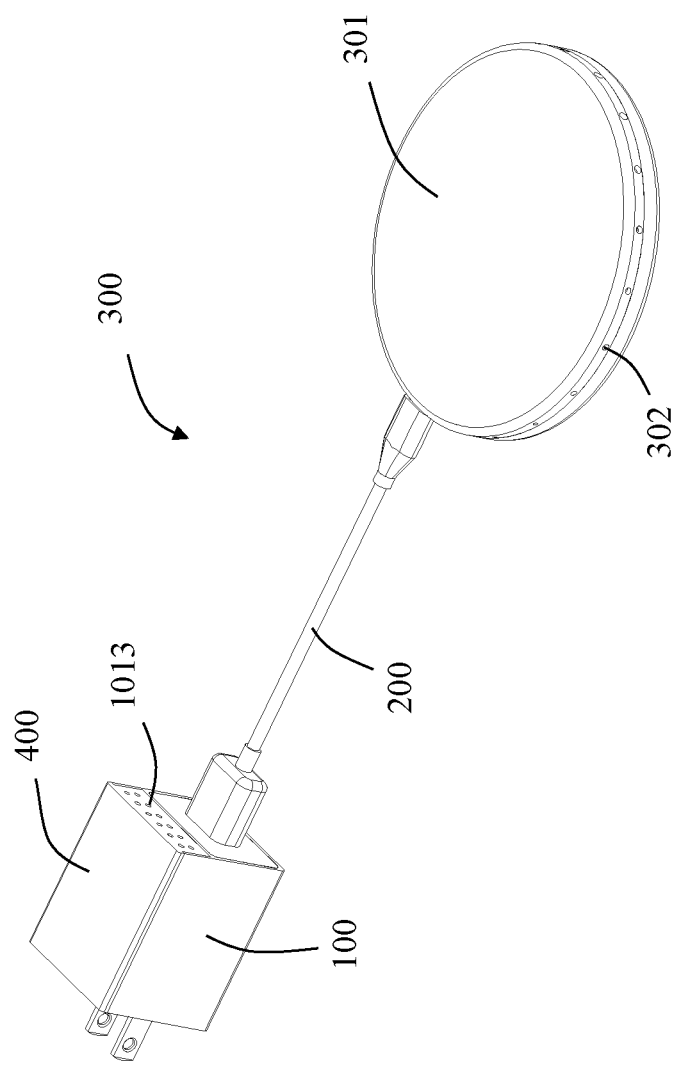
FIG. 16 is a perspective schematic view of the charger assembly in accordance with another embodiment of the present disclosure.
Figure 17:
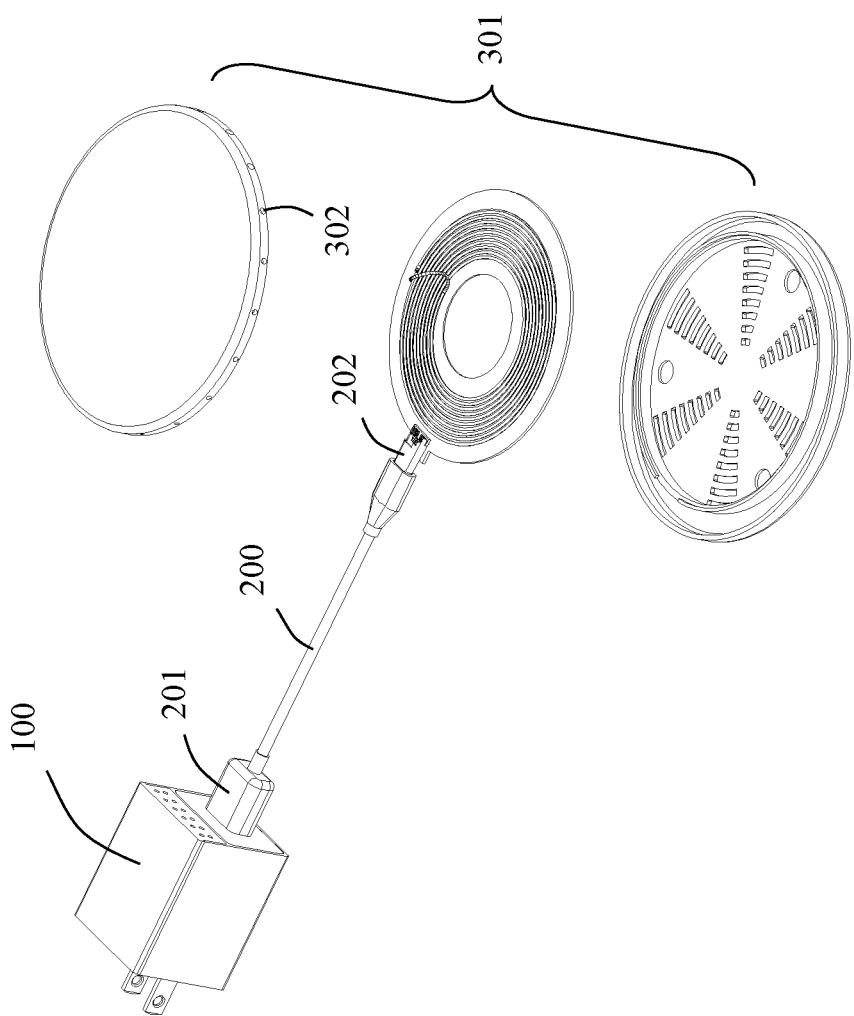
FIG. 17 is a partially exploded perspective view of FIG. 16.

The present disclosure also discloses a charger assembly 300 which includes the charger 400 and the electronic device. Referring to FIGS. 14 to 17, in the illustrated embodiment of the present disclosure, the electronic device is a wireless charging stand 301. The heat dissipation fan 102 can dissipate the heat generated by the wireless charging stand 301 through the heat dissipation channel 2033. Referring to FIGS. 16 and 17, in an embodiment of the present disclosure, the wireless charging stand 301 is provided with an airflow through hole 302 that communicates with the external environment.

When in use, electronic products (such as mobile phones) generate heat when they are in charging through the wireless charging stand 301. When it is detected that the heat is greater than the set value, the fan control board 103 will send a signal to drive the heat dissipation fan 102 to operate. In a rotation mode of the heat dissipation fan 102 (for example, a suction mode), heat will be sucked from an end adjacent to the wireless charging stand 301 to an end adjacent to the charger plug 100 through the heat dissipation channel 2033. The low-temperature air in the external environment enters through the airflow through holes 302. The heat is dissipated to the external environment through the installation space 104 and through the airflow perforations 1013, so that the heat generated by the electronic product during charging is absorbed and emitted by the low-temperature air in the external environment. As a result, the electronic product is cooled. In the suction mode of the heat dissipation fan 102, the airflow through holes 302 mainly play a role of letting air with a lower temperature in the external environment flow in, and the heat dissipation is mainly performed through the airflow holes 1013.

Of course, in other embodiments, in another rotation mode of the heat dissipation fan 102 (for example, an air supply mode), the air with a lower temperature in the external environment is sucked into the heat dissipation channel 2033 through the airflow perforations 1013. Then, through the airflow through holes 302 provided on the wireless charging stand 301, the air with a lower temperature in the external environment is transported to the wireless charging stand 301 and absorbed, and the heat is dissipated from the airflow through holes 302 to the external environment, which can also achieve the purpose of the present disclosure. In the air supply mode of the heat dissipation fan 102, the airflow perforation 1013 mainly plays a role of letting the air with a lower temperature in the external environment flow in, and the heat dissipation is mainly performed through the airflow through holes 302. The first heat dissipation through hole 2013 on the first connector 201 and/or the second heat dissipation through hole (not shown) on the second connector 202 can accelerate the flow of hot air near the wireless charging stand 301, thereby further improving the heat dissipation effect. When the electronic product is another electronic device, the heat inside the electronic device can also be dissipated through the above-mentioned heat dissipation structure.

Compared with the prior art, the present disclosure arranges heat dissipation functional components on the connecting cable 203 and the charger plug 100, so that there is no need to make many design changes to the wireless charging stand 301. As a result, the thin and light design of the wireless charging stand 301 can be maintained. In addition, on the basis of the improved heat dissipation effect, the power of the wireless charging stand 301 can be increased, thereby shortening the charging time.

The above embodiments are only used to illustrate the present disclosure and not to limit the technical solutions described in the present disclosure. The understanding of this specification should be based on those skilled in the art. Descriptions of directions, such as "front", "back", "left", "right", "top" and "bottom", although they have been described in detail in the above-mentioned embodiments of the present disclosure, those skilled in the art should understand that modifications or equivalent substitutions can still be made to the application, and all technical solutions and improvements that do not depart from the spirit and scope of the application should be covered by the claims of the application.

What is claimed is:

1. A charger, comprising:
   a charger plug; and
   a connecting cable connected to the charger plug;
   wherein the charger plug comprises a heat dissipation fan, the connecting cable comprises a first end, a second end, and a heat dissipation channel in communication with the first end and the second end, the first end is indirectly connected to the charger plug, the second end is adapted to connect with an electronic device;
   wherein the connecting cable comprises a plurality of core wires and a heat dissipation pipe wrapped by the plurality of core wires; the heat dissipation channel is hollow and formed in the heat dissipation pipe; the heat dissipation channel is configured to communicate with an outside environment through the first end and the second end;
   wherein the first end, the heat dissipation channel and the second end are configured to allow air to flow in from one of the first end and the second end, pass through the heat dissipation channel, and flow out from a remaining one of the first end and the second end;
   wherein the heat dissipation fan is configured to promote the air to flow so that heat generated by the electronic device is dissipated through the first end, the heat dissipation channel and the second end;
   wherein the first end of the connecting cable is connected to a first connector, and the charger plug comprises a mating connector that is mateable with the first connector; and
   wherein the first connector comprises a first insulating coating shell, and the first insulating coating shell is provided with at least one first heat dissipation through hole in communication with the heat dissipation channel.

2. The charger according to claim 1, wherein the second end of the connecting cable is connected to a second connector, the second connector comprises a second insulating coating shell, the second insulating coating shell comprises at least one second heat dissipation through hole in communication with the heat dissipation channel, the heat dissipation channel is in communication with at least one first heat dissipation through hole and at least one second heat dissipation through hole.

3. A charger assembly, comprising:
a charger, comprising:
a charger plug; and
a connecting cable connected to the charger plug;
wherein the charger plug comprises a heat dissipation fan, the connecting cable comprises a first end, a second end, and a heat dissipation channel in communication with the first end and the second end, the first end is directly or indirectly connected to the charger plug, the second end is adapted to connect with an electronic device; and wherein the heat dissipation fan is capable of dissipating heat generated by the electronic device through the heat dissipation channel;
wherein the charger defines an airflow perforation in communication with the heat dissipation channel; and
wherein the charger assembly further comprises an electronic device which is a wireless charging stand, the wireless charging stand is provided with an airflow through hole in communication with the heat dissipation channel, and the heat dissipation fan is capable of dissipating heat generated by the wireless charging stand through the airflow perforation or the airflow through hole;

wherein the first end of the connecting cable is connected to a first connector, and the charger plug comprises a mating connector that is mateable with the first connector;
wherein the first connector comprises a first insulating coating shell, and the first insulating coating shell is provided with at least one first heat dissipation through hole in communication with the heat dissipation channel.

4. The charger assembly according to claim 3, wherein the second end of the connecting cable is connected to a second connector, the second connector comprises a second insulating coating shell, the second insulating coating shell comprises at least one second heat dissipation through hole in communication with the heat dissipation channel, the heat dissipation channel is in communication with at least one first heat dissipation through hole and at least one second heat dissipation through hole.

5. The charger according to claim 1, wherein the charger plug comprises an insulating housing, the insulating housing comprises an installation space in which the heat dissipation fan is installed, and the installation space is in communication with the heat dissipation channel.

6. The charger according to claim 5, wherein the insulating housing is provided with an airflow perforation that communicates the installation space with the outside environment.

7. The charger according to claim 1, wherein the charger plug comprises a fan control board to control the heat dissipation fan.

8. The charger assembly according to claim 3, wherein the connecting cable comprises a plurality of core wires and a heat dissipation pipe wrapped by the plurality of core wires; the heat dissipation channel is hollow and formed in the heat dissipation pipe.

* * * * *